(12) United States Patent
Bellino et al.

(10) Patent No.: US 8,985,049 B2
(45) Date of Patent: Mar. 24, 2015

(54) PRESSURE MASKERS AND PRESSURE MASKING SYSTEMS

(71) Applicant: General Electric Company, Schenectady, NY (US)

(72) Inventors: Mark Carmine Bellino, Greenville, SC (US); Jonathan Matthew Lomas, Simpsonville, SC (US); Matthew Paul Berkebile, Pooler, GA (US); Michael Anthony DePalma, III, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/826,017

(22) Filed: Mar. 14, 2013

(65) Prior Publication Data

US 2013/0174923 A1    Jul. 11, 2013

Related U.S. Application Data

(63) Continuation-in-part of application No. 13/339,468, filed on Dec. 29, 2011, and a continuation-in-part of application No. 13/339,449, filed on Dec. 29, 2011.

(51) Int. Cl.
| | |
|---|---|
| B05C 21/00 | (2006.01) |
| B08B 17/02 | (2006.01) |
| C23C 14/04 | (2006.01) |
| C23C 4/00 | (2006.01) |
| C23C 16/04 | (2006.01) |
| F01D 5/28 | (2006.01) |
| F01D 5/30 | (2006.01) |

(52) U.S. Cl.
CPC .............. *B08B 17/02* (2013.01); *B05C 21/005* (2013.01); *C23C 14/042* (2013.01); *C23C 4/005* (2013.01); *C23C 16/042* (2013.01); *F01D 5/286* (2013.01); *F01D 5/288* (2013.01); *F01D 5/3092* (2013.01)
USPC ..... 118/504; 137/560; 156/345.3; 204/275.1; 205/118; 216/41

(58) Field of Classification Search
None
See application file for complete search history.

(56) References Cited

U.S. PATENT DOCUMENTS

| | | | |
|---|---|---|---|
| 5,263,504 A | * | 11/1993 | Bailey et al. .................. 134/176 |
| 5,800,695 A | | 9/1998 | Kang et al. |
| 6,365,013 B1 | | 4/2002 | Beele |
| 6,645,299 B2 | | 11/2003 | Brown |
| 6,667,076 B2 | | 12/2003 | Fried et al. |
| 6,878,046 B2 | | 4/2005 | Publ et al. |
| 7,192,622 B2 | | 3/2007 | Fernihough et al. |
| 7,622,160 B2 | | 11/2009 | Gupta et al. |
| 7,805,822 B2 | | 10/2010 | Hanley |

(Continued)

*Primary Examiner* — Dah-Wei D Yuan
*Assistant Examiner* — Jethro M Pence
(74) *Attorney, Agent, or Firm* — Blake A. Nickles; Ernest G. Cusick; Frank A. Landgraff

(57) ABSTRACT

Pressure maskers for masking at least one passageway of an article include a body portion that surrounds at least a portion of the article around the at least one passageway, at least one fluid inlet connected to the body portion that provides a conduit for pressurized masking fluid to pass from an exterior of the pressure masker to an interior of the pressure masker, wherein the article is at least partially disposed within the interior of the pressure masker, and at least one seal that seals the body portion at least partially around the article such that the pressurized masking fluid that enters the interior of the pressure masker is at least partially forced through the at least one passageway.

8 Claims, 6 Drawing Sheets

(56) References Cited

U.S. PATENT DOCUMENTS

| | | |
|---|---|---|
| 7,947,161 B2 | 5/2011 | Gebhart et al. |
| 8,021,719 B2 | 9/2011 | Graichen |
| 2009/0226626 A1* | 9/2009 | Gupta et al. .................. 427/448 |
| 2011/0086169 A1* | 4/2011 | Graicheno .................... 427/300 |
| 2012/0087802 A1 | 4/2012 | von Niessen et al. |
| 2012/0261074 A1* | 10/2012 | Wang ............................ 156/367 |

\* cited by examiner

PRESSURE MASKERS AND PRESSURE MASKING SYSTEMS

CROSS REFERENCE TO RELATED APPLICATIONS

This application is a continuation-in-part to U.S. patent application Ser. No. 13/339,468, filed on Dec. 29, 2011 and U.S. patent application Ser. No. 13/339,449, filed on Dec. 29, 2011 both of which are fully incorporated herein by reference and made a part hereof.

BACKGROUND OF THE INVENTION

The subject matter disclosed herein relates to masking systems and, more specifically, to pressure masking systems for treating articles with passageways.

In gas turbine engines, such as aircraft engines for example, air is drawn into the front of the engine, compressed by a shaft-mounted rotary-type compressor, and mixed with fuel. The mixture is burned, and the hot exhaust gases are passed through a turbine mounted on a shaft. The flow of gas turns the turbine, which turns the shaft and drives the compressor and fan. The hot exhaust gases flow from the back of the engine, driving it and the aircraft forward.

During operation of gas turbine engines, the temperatures of combustion gases may exceed 3,000° F., considerably higher than the melting temperatures of the metal parts of the engine which are in contact with these gases. Operation of these engines at gas temperatures that are above the metal part melting temperatures is a well-established art, and depends in part on supplying a cooling air to the outer surfaces of the metal parts through various methods. The metal parts of these engines that are particularly subject to high temperatures, and thus require particular attention with respect to cooling, are the metal parts forming combustors and parts located aft of the combustor.

The metal temperatures can be maintained below melting levels by using passageways such as cooling holes incorporated into some engine components. Sometimes, thermal barrier coatings (TBCs) may also be applied to the component by a pressure coating process (e.g., a thermal spray process). However, the thermal spray process and other cleaning processes (e.g., grit blasting, shot peening, water jet washing) often results in overspray that partially or completely blocks the component's cooling holes.

As a result, present coating and cleaning processes involve a multi-step, highly labor intensive process of applying a partial layer of TBC coating, allowing the component and the TBC to sufficiently cool to a temperature at which the component can easily be handled, removing the component from an application fixture on which the thermal spraying takes place, and removing any masking, which is then followed by separately removing the well-cooled, solidified coating from the cooling holes using a water jet or other cleaning methods. To prevent the cooling holes from becoming obstructed beyond a level from which they can be satisfactorily cleaned, only a fraction of the desired TBC thickness is applied prior to cleaning. As a result, the entire process must typically be repeated several times until the desired TBC thickness is reached. This complex process results in low productivity, high cycle time, and increases costs by a factor of five to ten times that of applying the same TBC to a similar non-holed part. Even when coatings are not applied, the pressure cleaning methods used to clean the target surfaces of articles can similarly overflow and obstruct the article's cooling holes.

Accordingly, alternative pressure masking systems would be welcomed in the art.

BRIEF DESCRIPTION OF THE INVENTION

In one embodiment a pressure masker is disclosed for masking at least one passageway of an article. The pressure masker includes a body portion that surrounds at least a portion of the article around the at least one passageway, at least one fluid inlet connected to the body portion that provides a conduit for pressurized masking fluid to pass from an exterior of the pressure masker to an interior of the pressure masker, wherein the article is at least partially disposed within the interior of the pressure masker, and at least one seal that seals the body portion at least partially around the article such that the pressurized masking fluid that enters the interior of the pressure masker is at least partially forced through the at least one passageway.

In another embodiment, another pressure masker is disclosed for masking at least one passageway of an article. The pressure masker includes a seal that seals at least partially around the at least one passageway on a first side of the article, and at least one fluid inlet fluidly connected to the seal that provides a conduit for pressurized masking fluid to pass from an exterior of the pressure masker through the at least one passageway and out a second side of the article.

In yet another embodiment, a pressure masker system is disclosed for masking a plurality of passageways of an article. The pressure masker system includes a plurality of seals that seal at least partially around the plurality of passageways on a first side of the article, and at least one fluid inlet fluidly connected to each seal that provides a conduit for pressurized masking fluid to pass from an exterior of the pressure masker through the plurality of passageways and out a second side of the article.

These and additional features provided by the embodiments discussed herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the inventions defined by the claims. The following detailed description of the illustrative embodiments can be understood when read in conjunction with the following drawings, where like structure is indicated with like reference numerals and in which:

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Pressurized masking systems disclosed herein generally comprise a pressure masker and a surface treatment system to coat the target surface of an article comprising passageways. While the surface treatment system disposes surface treating material on the target surface, pressurized masking fluid is fluidly connected to the passageways and passed there through to prevent the permanent altering a cross sectional area of the passageway of the passageways by the surface treating material. Pressurized masking systems, and methods of pressure treating a target surface of an article will be discussed in more detail herein.

Figure 1:
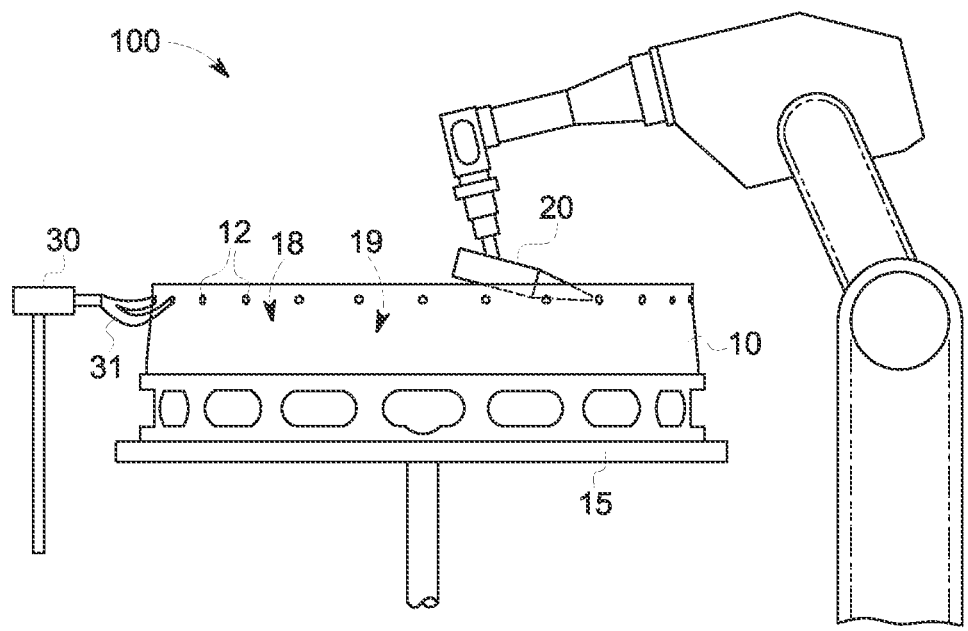
FIG. 1 is a schematic illustration of a pressure masking system according to one or more embodiments shown or described herein.
Figure 2:
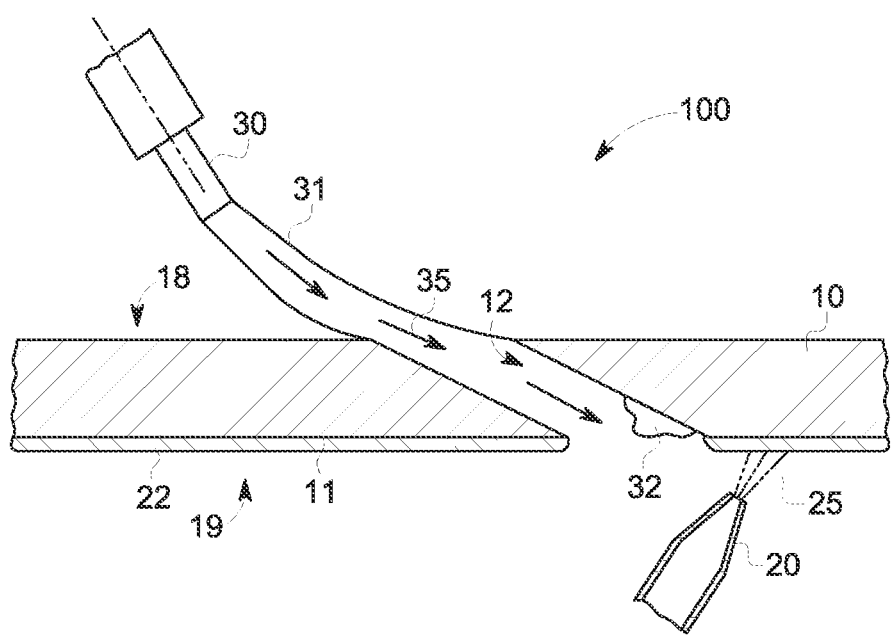
FIG. 2 is a perspective view of a pressure masking system according to one or more embodiments shown or described herein.
Figure 3:
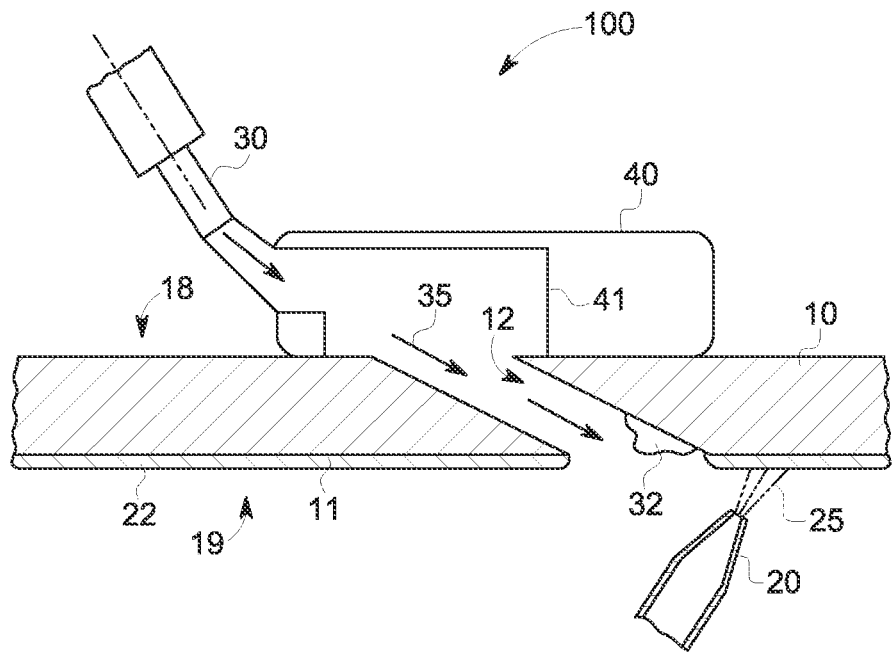
FIG. 3 is a perspective view of another pressure masking system according to one or more embodiments shown or described herein.
Figure 4:
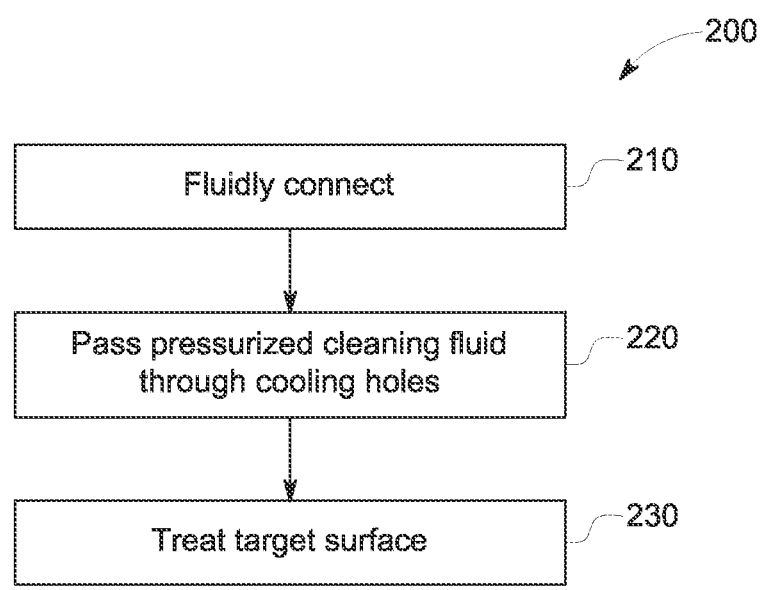
FIG. 4 is a method of treating an article using a pressure masking system according to one or more embodiments shown or described herein.

Referring now to FIGS. 1-3, a pressurized masking system 100 is illustrated comprising a surface treatment system 20 and a pressure masker 30 for treating an article 10. The article 10 comprises one or more passageways 12 passing through the article 10 from a first side 18 to a second side 19. As discussed above, the article 10 can comprise a variety of different components of a turbine. For example, the article 10 can comprise a liner, bucket, blade, vane, nozzle, or shroud. In some embodiments, the article 10 can comprise a turbine component such as a hot gas path component or a combustion component. In other embodiments, the article 10 can comprise any other component of a turbine such as a component for a gas turbine, industrial gas turbine, steam turbine or the like. The passageways 12 can comprise any passage through the article 10 (passing from the first side 18 to the second side 19) that is intended to remain open (such that air can pass through) when the article 10 is in use. For example, in some embodiments the passageways 12 may comprise cooling holes.

As best illustrated in FIGS. 2-3, the second side 19 of the article 10 comprises a target surface 11 that is to be coated. The target surface 11 may be coated prior to first use, during routine or repair maintenance, or as otherwise necessary depending on the life of the article 10. As used herein, "coated" refers to at least partially applying a new material to a surface such as through the use of a thermal spray gun or the like as will become appreciated herein.

In some embodiments, such as when the article 10 comprises a hot gas path component, the target surface 11 of the article 10 may have a thermal barrier coating ("TBC") coated thereon prior to operation. The TBC can comprise one or more layers of metal and/or ceramic surface treating material applied to the target surface 11 of the article 10 to impede the transfer of heat from hot combustion gases to the article 10, thus insulating the component from the hot combustion gas. The presence of the TBC on the surface permits the combustion gas to be hotter than would otherwise be possible with the particular material and fabrication process of the component. Any suitable composition of TBC may be applied. For example, in some embodiments the TBC can comprise a bond layer of MCrAlY, wherein M is preferably Ni, Co, or a combination thereof, followed by a layer of yttria stabilized zirconia (YSZ).

In some embodiments, the article 10 may be disposed on a support stand 15 prior to or during the pressure treating as will become appreciated herein. The support stand 15 may be stationary or mobile (e.g., rotatable) and position the article 10 relative to the surface treatment system 20 and the pressure masker 30 when treating the target surface 11 of the article 10.

Still referring to FIGS. 1-3, the pressurized masking system 100 further comprises the surface treatment system 20. The surface treatment system 20 comprises any device that disposes a surface treating material 25 on the target surface 11 of the article 10 to form a permanent or temporary coating 22 or the like. For example, in some embodiments, the surface treatment system 20 can comprise a thermal spray gun. In such embodiments, the pressurized surface treating material 25 can comprise pressurized gas or a pressurized liquid (e.g., as water). In other embodiments, the surface treatment system 20 can comprise any other device that disposes surface treating material 25 on the target surface 11 of the article 10.

The surface treatment system 20 may be disposed at any position relative to the article 10 that allows for the treating of the target surface 11. As used herein, "treating" refers to any operation that mechanically, chemically or otherwise modifies at least a portion of the surface of the article. For example, treating can include, but is not limited to, coating, stripping, cleaning, cladding or the like and may be achieved through a variety of surface treatment systems 20 as will become appreciated herein.

For example, as illustrated in FIG. 1, in some embodiments the article 10 may be disposed on a support stand 15 adjacent the surface treatment system 20. The support stand 15 may then be able to rotate or otherwise displace the article 10 with respect to the surface treatment system 20 and/or the surface treatment system 20 may be able to articulate with respect to the article 10. The surface treatment system 20 may then be used to dispose the surface treating material 25 on the target surface 11 of the article 10. However, as a result of surface treating material 25 being disposed on the target surface 11 of the article 10, some of the surface treating material 25 may enter one or more of the passageways 12 from the second side 19 of the article 10. As such, some of the surface treating material 25 may potentially form obstructions 32 in the one or more passageways 12 if left unopposed.

The surface treatment system 20 may be used for a variety of applications to coat, strip or otherwise treat the target surface 11 of the article 10. For example in some embodiments the surface treatment system 20 may be used to coat the target surface with a TBC as discussed above. In some embodiments, the surface treatment system 20 may be used to apply a bond coat to the target surface 11 for the subsequent application of a TBC or other coating. In some embodiments, the surface treatment system 20 may be used to apply a paint coat to the target surface 11. In some embodiments, the surface treatment system 20 may be used to apply other coatings such as diffusion coatings, DVC TBC, HVOF or other adhesive bonding coatings. In other embodiments, the surface treatment system 20 can comprise any cladding system, plating system, diffusion coating system, stripping system or the like While specific embodiments have been presented herein, it should be appreciated that these are exemplary only and any other application of the surface treatment system 20 as part of the pressurized masking system 100 may also be realized.

Referring still to FIGS. 1-3, the pressurized masking system 100 further comprises a pressure masker 30. The pressure masker 30 comprises a fluid connection 31 that fluidly connects a source of pressurized masking fluid 35 to at least one passageway 12 of the article 10. As used herein, "fluid connection" refers to a connection that allows the pressurized masking fluid 35 to pass from the pressure masker 30 to the passageway 12 with negligent loss to the outside environment. The fluid connection can comprise, for example, flexible tubes, hoses, pipes or any other conduit that directs the passage of the pressurized masking fluid 35 to one or more passageways 12.

In one embodiment, such as that illustrated in FIG. 2, the fluid connection 31 may comprise a tube that directly connects the output of the pressure masker 30 to the first side 18 of the passageway 12. In some embodiments, the fluid connection 31 may comprise a single tube between the pressure masker 30 and a single passageway 12 (such as that illustrated in FIG. 2). In other embodiments, the fluid connection may comprise a single tube leaving the pressure masker 30 that breaks off into segments that connect to a plurality of passageways 12 (such as that illustrated in FIG. 1). In even other embodiments, the fluid connection 31 may comprise a plurality of tubes leaving the pressure masker 30 that connects to a single or a plurality of passageways 12. For example, the fluid connection 31 may comprise a plurality of channels of similar or dissimilar pressurized masking fluids 35 that connect to two or more passageways. Moreover, the plurality of channels may comprise different pressures, temperatures, directions or mixtures of pressurized masking fluids 35. It should be appreciated that any other configuration that provides a fluid connection 31 between the pressure masker 30 and one or more passageways 12 may alternatively or additionally be realized.

For example, referring now to FIG. 3, in some embodiments the fluid connection 31 may comprise a multi-outlet manifold connection 40 comprising an internal passage 41 that can receive pressurized masking fluid 35 from the pressure masker 30 and fluidly distribute it to one or more passageways. The multi-outlet manifold connection 40 can thereby attach directly to the first side 18 of the article 10 and distribute the pressurized masking fluid 35 to a wide area about the article 10. Any passageways 12 within that area will thereby have pressurized masking fluid 35 fluidly pass there through.

The pressure masker 30 may comprise a variety of configurations to facilitate pressure masking. For example, referring to FIGS. 5-11, the pressure masker 30 may comprise a variety of different embodiments such as one that utilizes a body portion, at least one fluid inlet and at least one seal (e.g., FIGS. 5-7), one that utilizes just a seal and at least one fluid inlet (e.g., FIGS. 8-9 and 11), and/or one that utilizes combinations thereof (e.g., FIG. 10). Each embodiment may be specifically adapted for one or more different articles such as specific turbine components as discussed in more detail herewith.

Figure 5:
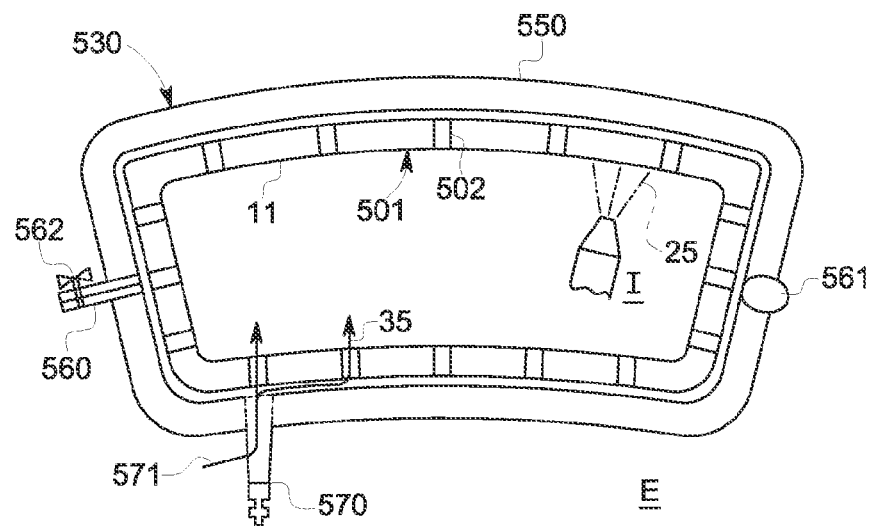
FIG. 5 is a schematic illustration of a pressure masker with a transition piece according to one or more embodiments shown or described herein.
Figure 6:
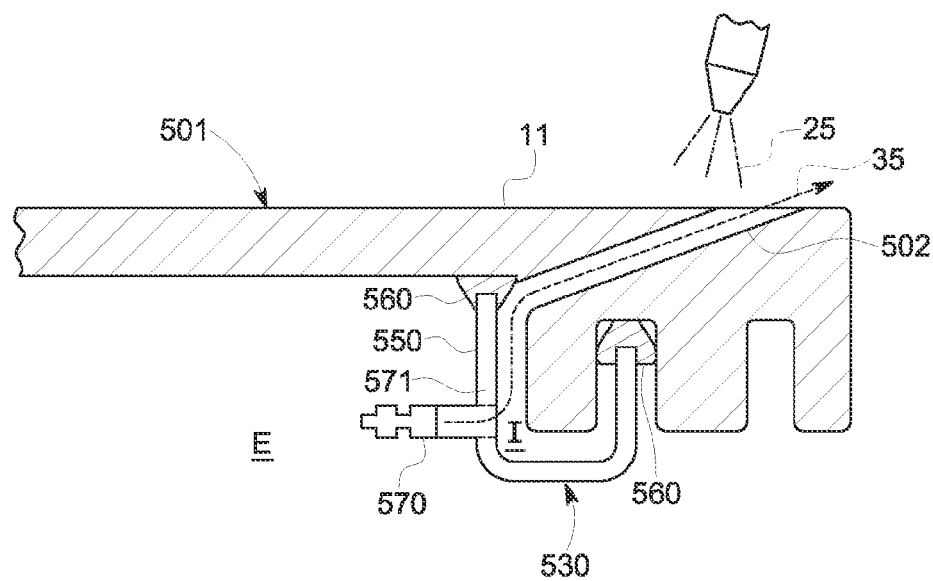
FIG. 6 is another schematic illustration of a pressure masker with a transition piece according to one or more embodiments shown or described herein.

Referring to FIG. 5, a first embodiment of a pressure masker 530 is illustrated pressure masking an article comprising a transition piece 501 having a plurality of passageways 502 (e.g., cooling holes). The interior surface of the transition piece 501 may comprise a target surface 11 that is to be coated, stripped or otherwise treated by a surface treating material 25. The pressure masker 530 can thus comprise a body portion 550, at least one fluid inlet 570 and at least one seal 560.

The body portion 550 surrounds at least a portion of the transition piece 501 around at least one passageway 502. For example, in the illustrated embodiments, the body portion 550 can surround the entire transition piece 501 so that it surrounds all of the passageways 502. However, in other embodiments, the body portion 550 may only surround a portion of the transition piece 501 so that it only surrounds one or more of the passageways 502. The body portion 550 can comprise any material, structure and shape that at least partially prevents the escape of pressurized masking fluid 35 from the interior I to the exterior E of the pressure masker 530. For example, in some embodiments, the body portion 550 is impermeable such that the pressurized masking fluid 35 cannot pass through the body portion 550 from the interior I to the exterior E. The impermeable body portion 550 can ensure the pressurized masking fluid 35 has the greatest force when travelling through the passageways 502 by preventing the premature release of pressure.

The at least one fluid inlet 570 is connected to the body portion 550 so that it provides a conduit 571 for pressurized masking fluid 35. The pressurized masking fluid 35 can thereby pass from an exterior E of the pressure masker 530 to the interior I of the pressure masker while the transition piece 501 is at least partially disposed within the interior I of the pressure masker 530. The at least one fluid inlet 570 can comprise a gasket, tube, hose, pipe or any other inlet suitable for providing a conduit 571 for passing pressurized masking fluid 35. In some embodiments, such as that illustrated in FIG. 5, the fluid inlet 570 may provide a single conduit for passing pressurized masking fluid 35 from a single source (not illustrated) to a single location in the interior I of the pressure masker 530. However, in other embodiments, the fluid inlet 570 may comprise multiple conduits 571 and/or the pressure masker 530 may comprise multiple fluid inlets 570 so that pressurized masking fluid 35 may be provided from multiple sources to multiple locations in the interior I of the pressure masker 530. For example, a single fluid inlet 570 may provide pressurized masking fluid 35 for all of the passageways 502, or separate fluid inlets 570 may provide pressurized masking fluid 35 for each different passageway 502 (or specific groups of passageways 502). In the latter configuration, the different fluid inlets 570 for different passageways 502 may allow for more control of the individual masking pressure provided to each specific passageway 502 during operation.

Still referring to FIG. 5, the pressure masker 530 further comprises at least one seal 560. The at least one seal 560 can seal the body portion 550 at least partially around the transition piece 501 (or other article) such that the pressurized masking fluid 35 that enters the interior I of the pressure masker 530 is at least partially forced through the at least one passageway 502. Specifically, the at least one seal 560 seals the pressure masker 530 against itself (as illustrated) and/or against the transition piece 501 (or other article) so that at least some of the pressurized masking fluid 35 travels through one or more passageways 502. The at least one seal 560 can comprise any type of seal suitable for at least partially preventing the escape of pressurized masking fluid 35. For example, in some embodiments, the seal 560 can comprise one or more rubber flanges (as illustrated), stoppers, or the like.

Depending on the configuration, the pressure masker 530 may further comprise one or more additional features to assist in the pressure masking of the transition piece 501 (or other article). For example, as illustrated in FIG. 5, the pressure masker 530 can comprise a hinge 561 that transitions the pressure masker 530 between an open position and a sealed position. In such embodiments, the pressure masker 530 can further comprise a releasable securement device 562 that releasably secures the pressure masker 530 in the sealed position. The releasable securement device 562 can comprise any clamp, tie, clip or the like that is suitable for releasably maintaining the pressure masker 530 in the sealed position around the transition piece 501 (or other article).

As should be appreciated herein, the pressurized masking fluid 35 can thereby travel through the one or more passageways while surface treating material 25 is applied to a target surface 11 (e.g., the internal surface of the transition piece as illustrated) so that the pressurized masking fluid 35 prevents said surface treating material 25 from permanently altering of a cross sectional area.

While FIG. 5 illustrates one specific embodiment of a pressure masker 530 comprising a body portion 550, at least one fluid inlet 570 and at least one seal 560, it should be appreciated that the pressure masker 530 can comprise many other shapes, sizes and configurations and be utilized with many different articles. For example, referring now to FIG. 6, a variant of the pressure masker 530 is illustrated in cooperation with an end section of a transition piece 501. The pressure masker 530 still comprises the body portion 550, fluid inlet 570 and seals 560. However, compared to the embodiment illustrated in FIG. 5, the pressure masker 530 illustrated in FIG. 6 seals directly against the transition piece 501. Thus, the body portion 550 still surrounds at least a portion of the transition piece 501 (or other article) around at least one of the passageways 502. The fluid inlet 570 is connected to the body portion 550 and provides the conduit 571 for pressurized masking fluid 35 to pass from the exterior E of the pressure masker 530 to the interior I of the pressure masker 530 while the transition piece 501 is partially disposed within the interior I. Furthermore, two seals 560 seal the body portion 550 to the transition piece 501 to force the pressurized masking fluid 35 through the passageway 502. As a result, the pressurized masking fluid 35 prevents surface treating material 25 from permanently altering the cross sectional area of the passageway 35 and should become appreciated herein.

Figure 7:
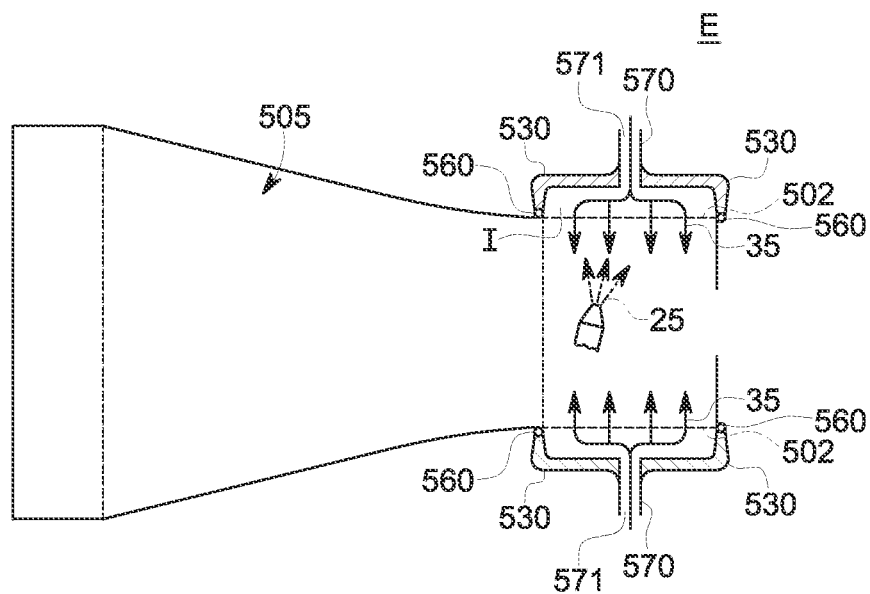
FIG. 7 is a schematic illustration of a pressure masker with a liner according to one or more embodiments shown or described herein.

Likewise, referring now to FIG. 7, another variant of the pressure masker 530 comprising a body portion 550, fluid inlet 570 and seal 560 is illustrated. In this embodiment, the pressure masker 530 is illustrated in cooperation with a liner 505 comprising a plurality of passageways 502. Similar to the embodiment illustrated in FIG. 5, the pressure masker 530 illustrated in FIG. 7 provides pressurized masking fluid 35 to multiple passageways 502. However, similar to the embodiment illustrated in FIG. 6, the pressure masker 530 illustrated in FIG. 7 seals directly against the article (i.e., the liner 505). Thus, the body portion 550 still surrounds at least a portion of the liner 505 (or other article) around at least one of the passageways 502. The fluid inlets 570 are connected to the body portion 550 and provide the conduits 571 for pressurized masking fluid 35 to pass from the exterior E of the pressure masker 530 to the interior I of the pressure masker 530 while the liner 505 is partly disposed within the interior I. Furthermore, seals 560 seal the body portion 550 to the liner 505 to force the pressurized masking fluid 35 through the passageways 502. As a result, the pressurized masking fluid 35 prevents surface treating material 25 from permanently altering the cross sectional area of the passageways 35 as should become appreciated herein.

As stated above, in some embodiments the pressure masker may comprise at least one seal and at least one fluid inlet without a distinct body portion. For example, referring to FIGS. 8 and 9, another embodiment of a pressure masker 630 is illustrated comprising a seal 660 and a fluid inlet 670 (such that the fluid inlet 670 and/or seal 660 essentially comprise the body portion discussed above). The pressure masker 630 is illustrated in cooperation with a cap 601 comprising at least one passageway 602.

The seal 660 seals against the at least one passageway 602 on a first side 611 of the cap 601 (or other article). As discussed above, the seal 660 can comprise any suitable material such as rubber flanges, stoppers (as illustrated), or the like. The at least one fluid inlet 670 is fluidly connected to the seal 660 such that it provides a conduit 671 for pressurized masking fluid 35 to pass from an exterior E of the pressure masker 630 through the at least one passageway 602 and out a second side 612 of the cap 601 (or other article). In some embodiments, such as that illustrated in FIGS. 8 and 9, the conduit 671 may be integral with and pass directly through the seal 660. In other embodiments, the one or more seals 660 may be disposed further away from the at least one passageway 602 such that the conduit 671 is physically separated from the one or more seals 660.

Depending on the configuration, the pressure masker 630 may further comprise one or more additional features to assist in the pressure masking of the cap 601 (or other article). For example, when the pressure masker 630 is utilized for a cap 601, the pressure masker 630 may be disposed between an inner wall 608 and an outer wall 609 of the cap 601. The pressure masker 630 can thereby comprise a securement expander 662 to expand between the inner wall 608 and the outer wall 609 to secure the seal 660 against the at least one passageway 602. The securement expander 663 can comprise any suitable device such as a screw based expander, spring based expander, ratchet based expander, or the like.

Figure 8:
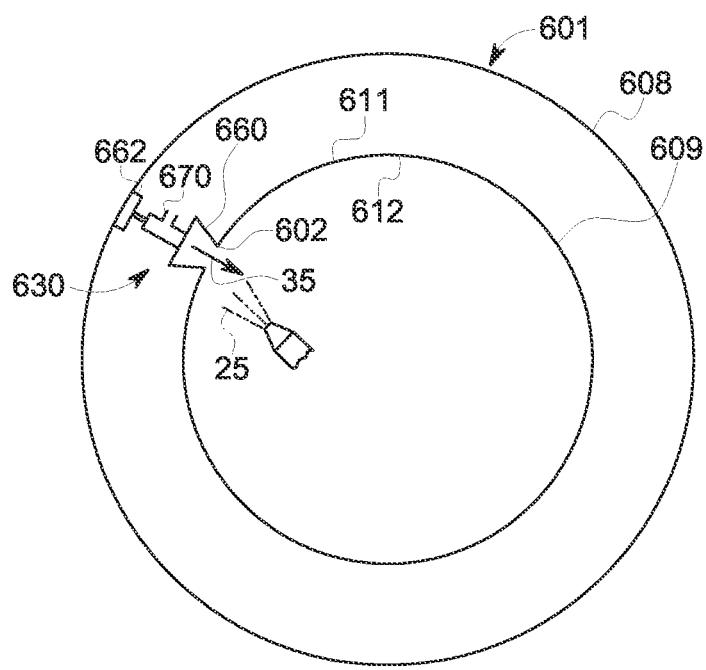
FIG. 8 is a top view of a schematic illustration of another pressure masker with a cap according to one or more embodiments shown or described herein.
Figure 9:
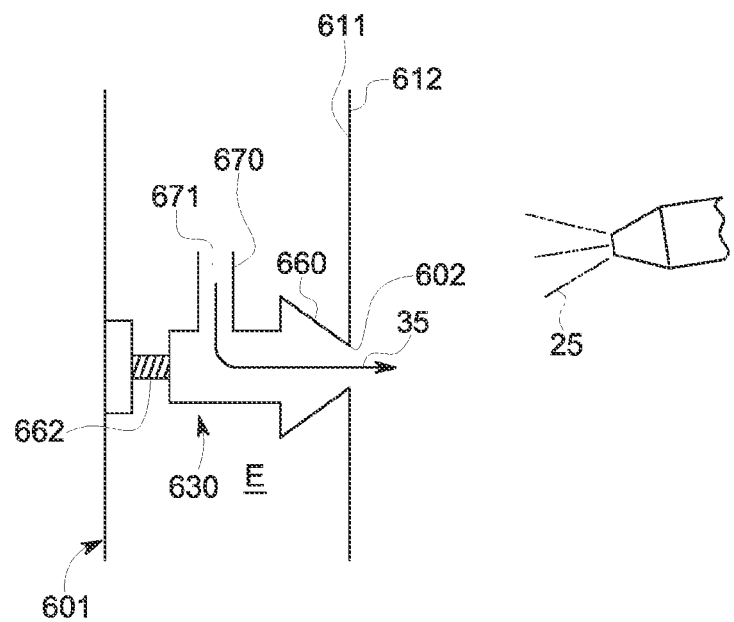
FIG. 9 is a side view of the schematic illustration of the pressure masker with the cap of FIG. 8 according to one or more embodiments shown or described herein.

Moreover, in some embodiments, such as that illustrated in FIGS. 8 and 9, the pressure masker may comprise a single seal 660 for a single passageway 602. However, in other embodiments, such as that illustrated in FIG. 10, a pressure masker system 631 may comprise a plurality of seals 660 that seal against a plurality of passageways 602 on a first side 611 of the article (e.g., a cap 601). For example, the pressure masker system 631 can comprise a fluid inlet 670 fluidly connected to each seal 660 by a plurality of conduits 671. Similar to the embodiments illustrated in FIGS. 8 and 9, the pressure masker system 631 can comprise a securement expander 662 to secure each seal 660 to its respective passageway 602 by expanding between the inner wall 608 and other wall 609 of the cap 601. The pressurized masking fluid 35 can thereby pass from an exterior E of the pressure masker system 631 through the plurality of passageways 602 and out a second side of the article (e.g., the cap 601).

Figure 10:
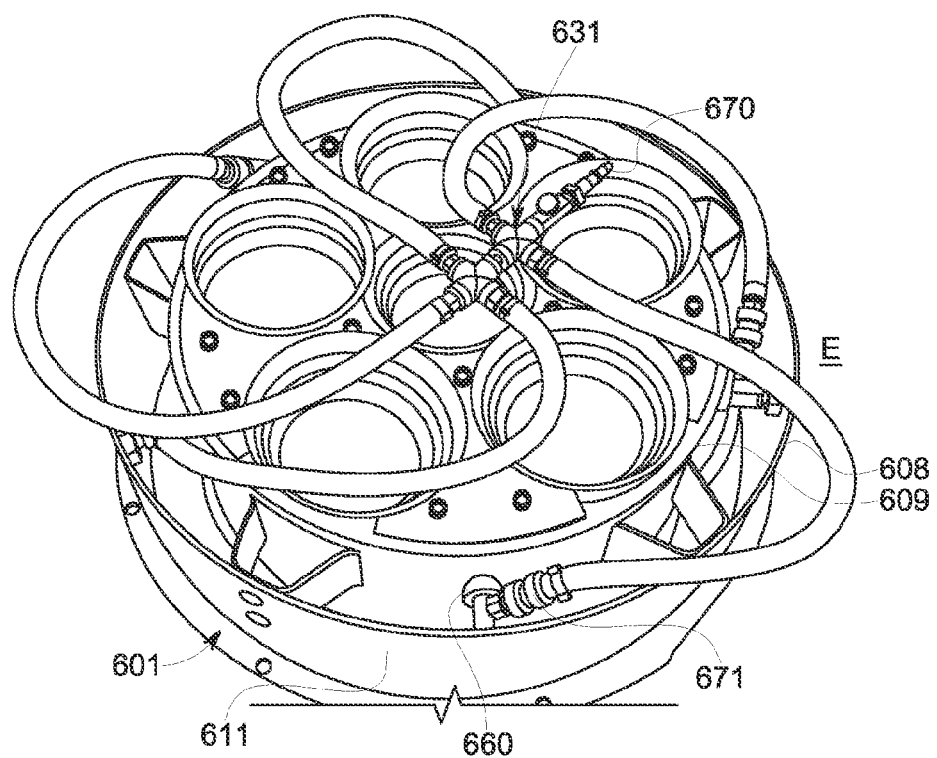
FIG. 10 is a schematic illustration of a pressure masking system with a cap according to one or more embodiments shown or described herein; and, FIG. 11 is a schematic illustration of a pressure masker with a bucket according to one or more embodiments shown or described herein.

While the pressure masker 630 embodiments illustrated in FIGS. 8-10 have been presented in conjunction with a cap 601, the pressure masker 630 may additionally or alternatively be incorporated to pressure mask a variety of other articles. For example, referring now to FIG. 11, another embodiment of the pressure masker 630 is illustrated in use with a bucket 603. The bucket 603 comprises a plurality of passageways 602 extending from its base 604 to its outer edge 605. The pressure masker 630 still comprises a seal 660 and a fluid inlet 670. The seal 660 can seal against the base 604 of the bucket 603 such that the conduit 671 fluidly connects to at least one passageway 602 of the bucket 603. The pressurized masking fluid 35 thereby passes from an exterior E of the pressure masker 630 through the at least one passageway 602 and out the bucket 603. The pressure masker 630 may further be utilized with any other article such as one or more different turbine components (e.g., blades, vanes, nozzles, shrouds and the like).

Figure 11:
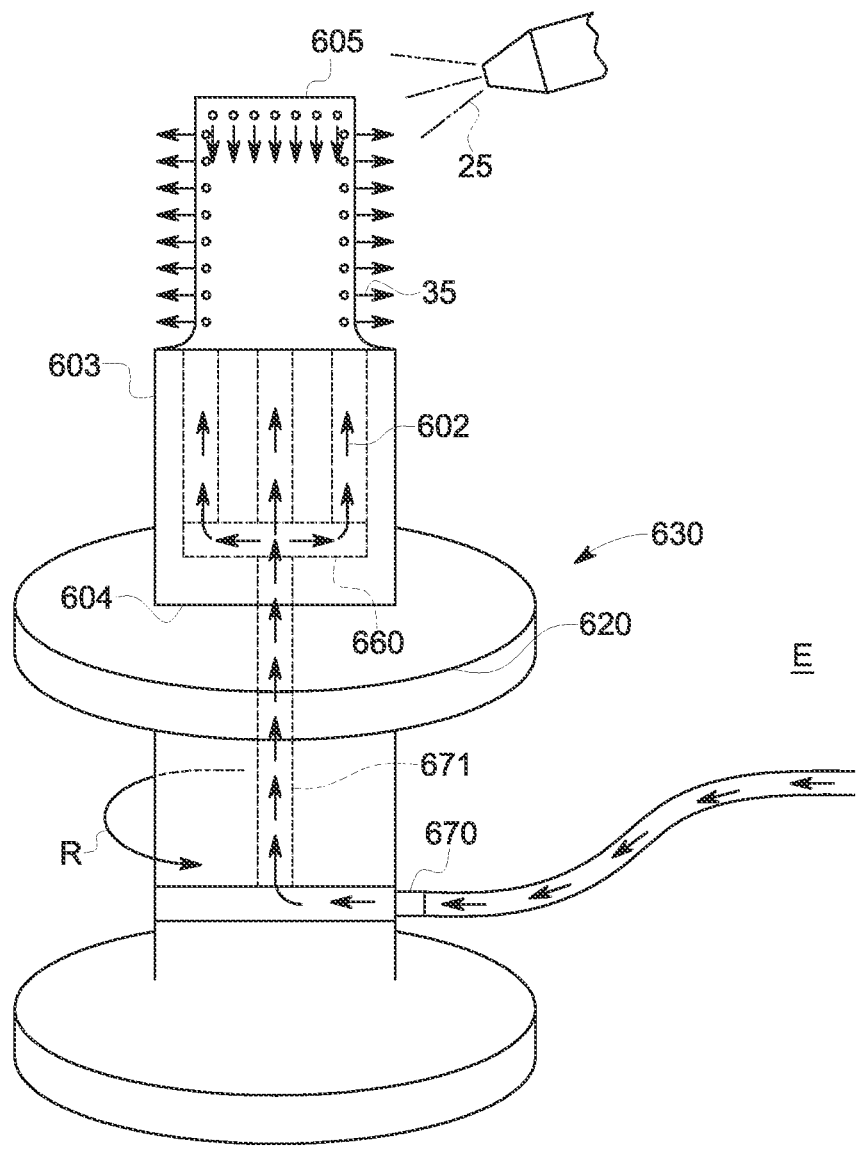

As also illustrated in FIG. 11, in some embodiments, the pressure masker may also comprise a support stand 620 that supports the article (e.g., bucket 603) during pressure masking. In even some embodiments, the support stand 620 may rotate R so that the bucket 603 (or other article) can rotate with respect to the surface treating material 25 during operation as should become appreciated herein.

The pressurized masking fluid 35 can comprise any medium that can pass through the passageway 12 with a positive energy and prevent the permanent altering of a cross sectional area of the at least one passageway by the surface treating material 25 (or particulates thereof). As used herein, "prevent the permanent altering of a cross sectional area" (and variants thereof) refers to removing and/or preventing substantially all of the surface treating material 25 that may enter the passageway 12 so that the cross sectional area of the passageway is not substantially reduced by a permanent obstruction 32 or increased due to erosion, deformation or the like. It should be appreciated that a thin coating of the interior walls directly proximate the second side 19 of the surface treating material 25 is not considered to permanently alter the cross sectional area of the passageway 12 as any such reduction would be relatively minimal and not noticeably affect the flow of air through the passageway 12 during operation. Examples of obstructions that would permanently alter the cross sectional area of the passageway 12 include, for example, large particulates lodged against a wall, a clumping of surface treating material 25 or the like. The pressurized masking fluid 35 may thereby comprise any material that can be forced through the one or more passageways 12 at a masking pressure to impact on and remove potential obstructions 32 from the surface treating material 25 that would alter the cross sectional area.

For example, in some embodiments, the pressurized masking fluid 35 may comprise a gas such as inert gas or nitrogen. In some embodiments, the pressurized masking fluid 35 may comprise water with or without abrasives distributed therein. While specific embodiments of pressurized masking fluid 35 and surface treatment systems have been presented herein, it should be appreciated that additional and alternative pressurized masking fluids and surface treatment systems may also be realized. Moreover, the pressurized masking fluid 35 may comprise a masking pressure that is greater than, equal to, or less than a treating pressure of the surface treating material 25 so long as the pressurized masking fluid 35 has enough energy to remove obstructions 32 from the passageways 12. In some embodiments, the masking pressure may comprise a positive pressure such that the positive pressure pushes the pressurized masking fluid 35 through the passageway 12. In other embodiments, the masking pressure may comprise a negative pressure (such as via a vacuum or suction element on the second side 19 of the article 10 such that the negative pressure pulls the pressurized masking fluid 35 through the passageway 12. In some embodiments, the masking pressure may comprise a variable pressure that fluctuates during the masking process.

In operation, the pressure masker 30 thereby passes the pressurized masking fluid 35 through the at least one passageway 12 at a masking pressure from the first side 18 to the second side 19 (wherein the second side 19 comprises the target surface 11 of the article 10 that is to be coated). Likewise, the surface treatment system 20 treats the target surface 11 of the article 10 by disposing surface treating material 25 on the target surface. As discussed above, this can include a variety of systems such as cladding systems, plating systems, diffusion systems, or stripping systems. As a result of flow pattern distributions, some of the surface treating material 25 may enter one or more passageways 12 and form one or more obstructions 32. For example, the obstructions 32 may comprise a grouping of particulates from the surface treating material that would decrease the cross sectional area of the passageway 12 and reduce the amount of air that could flow there through. However, to prevent the surface treating material 25 from permanently obstructing the at least one passageway 12 (and altering its cross sectional area), the pressurized masking fluid 35 will contact the obstruction 32 and push it back out of the passageway 12. In some embodiments, the pressurized masking fluid 35 may prevent any obstructions 32 from even entering the passageways 12 via the pressurized masking fluid 35 exiting the passageway 12 on the second side 19 of the article 10.

Referring now to FIGS. 1-4, a method 200 is illustrated for treating a target surface 11 of an article 10 comprising one or more passageways 12. The method 200 first comprises fluidly connecting the pressure masker 30 to a first side 18 of at least one passageway 12 of the article 10 in step 210. As discussed above, the fluid connection 31 may comprise a variety of configurations and may connect any type of pressure masker 30 to any number of passageways 12. The pressure masker 30 then passes pressurized masking fluid 35 through the at least one passageway from the first side 18 to the second side 19 in step 220. Likewise, the surface treatment system 20 treats the target surface 11 on the second side 19 of the article 10 by disposing or projecting surface treating material 25 on the target surface 11 in step 230.

It should be appreciated that passing pressurized masking fluid 35 through the at least one passageway 12 in step 220 and treating the target surface 11 in step 230 may start and end simultaneously or with relative delay. For example, in some embodiments the pressurized masking fluid 35 may already be passing through the passageway 12 in step 20 prior to the initiation of treating the target surface 11 in step 230. Such embodiments may prevent a buildup of obstructions 32 prior to activation of the pressure masker 30. In some embodiments, the pressurized masking fluid 35 may continue to pass through the passageway 12 in step 220 after the article 10 is treated in step 230. Such embodiments may help ensure any obstacles 32 remaining in the passageways 12 after treating is complete in step 230 are still removed by the pressurized masking fluid 35.

It should now be appreciated that pressurized masking systems may be used to treat the target surface of an article while preventing the permanent altering of a cross sectional area of one or more passageways. The use of a fluid connection between the pressure masker and the one or more passageways can prevent the need for physical masking barriers such as tape, wax or the like potentially providing a more efficient treating system.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A pressure masker for masking at least one passageway of an article, the pressure masker comprising:
   a body portion that surrounds at least a portion of the article around a first side of the at least one passageway, wherein the body portion does not surround a second side of the at least one passageway;
   at least one fluid inlet connected to the body portion that provides a conduit configured to pass pressurized masking fluid from an exterior of the pressure masker to an interior of the pressure masker, wherein the first side of the at least one passageway of the article is at least partially disposed within the interior of the pressure masker; and,
   at least one seal that seals the body portion at least partially around the article such that the pressurized masking fluid that enters the interior of the pressure masker is at least partially forced through the first side of the at least one passageway and exits out the second side of the at least one passageway.

2. The pressure masker of claim 1 further comprising a hinge that transitions the pressure masker between an open position and a sealed position around the article.

3. The pressure masker of claim 2 further comprising a releasable securement device that releasably secures the pressure masker in the sealed position.

4. The pressure masker of claim 1, wherein the body portion is impermeable such that the pressurized masking fluid cannot pass through the body portion from the interior of the pressure masker to the exterior of the pressure masker.

5. The pressure masker of claim 1, wherein the fluid inlet comprises the body portion.

6. The pressure masker of claim 1, wherein the at least one fluid inlet passes through the at least one seal.

7. The pressure masker of claim 1, wherein the article comprises a turbine component.

8. The pressure masker of claim 7, wherein the turbine component is a transition piece or a liner.

* * * * *